(12) United States Patent
Moscaluk

(10) Patent No.: US 9,667,240 B2
(45) Date of Patent: May 30, 2017

(54) SYSTEMS AND METHODS FOR STARTING UP ANALOG CIRCUITS

(75) Inventor: Gary Moscaluk, Colorado Springs, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/432,038

(22) Filed: Mar. 28, 2012

(65) Prior Publication Data
US 2013/0265089 A1    Oct. 10, 2013

Related U.S. Application Data

(60) Provisional application No. 61/566,233, filed on Dec. 2, 2011.

(51) Int. Cl.
*G05F 1/10* (2006.01)
*H03K 17/22* (2006.01)

(52) U.S. Cl.
CPC .................. *H03K 17/223* (2013.01)

(58) Field of Classification Search
CPC .............................. H02M 1/00; H02M 1/0061
USPC ..... 327/51, 77, 78, 530, 538, 540, 541, 543, 327/142, 143, 198; 323/238, 321, 901
See application file for complete search history.

(56) References Cited

U.S. PATENT DOCUMENTS

| | | |
|---|---|---|
| 4,061,987 A | 12/1977 | Nagahama |
| 4,075,536 A | 2/1978 | Stevens |
| 4,242,604 A | 12/1980 | Smith |
| 4,272,760 A | 6/1981 | Prazak et al. |
| 4,344,067 A | 8/1982 | Lee |
| 4,571,507 A | 2/1986 | Collings |
| 4,684,824 A | 8/1987 | Moberg |

(Continued)

FOREIGN PATENT DOCUMENTS

| | | |
|---|---|---|
| EP | 1625506 A | 2/2006 |
| JP | 287113 A1 | 11/1988 |

(Continued)

OTHER PUBLICATIONS

Jinbin Zhao, et al._Steady-State and Dynamic Analysis of a Buck Converter Using a Hysteretic PWM Control_Dated 2004_5 pages.

(Continued)

*Primary Examiner* — Sibin Chen

(57) ABSTRACT

Circuits, systems, and methods for starting up analog devices are provided. One circuit includes an output node at an output voltage (VOUT), a comparator configured to be coupled to a reference voltage (VREF), a feedback loop coupling the output node to the comparator, and a turbo circuit coupled between the output and the output node. The turbo circuit is configured to increase VOUT, the comparator is configured to compare VOUT and VREF, and the turbo circuit is enabled and disabled based on the comparison of VOUT and VREF. One system includes an analog device coupled to the above circuit. A method includes enabling the startup portion to start up the driver portion when VOUT is outside a predetermined voltage of VREF, disabling the startup portion when VOUT is within the predetermined voltage, and enabling the driver portion to drive the analog device subsequent to disabling the startup portion.

19 Claims, 3 Drawing Sheets

(56) References Cited

U.S. PATENT DOCUMENTS

| | | |
|---|---|---|
| 4,689,581 A | 8/1987 | Talbot |
| 4,689,740 A | 8/1987 | Moelands et al. |
| 4,692,718 A | 9/1987 | Roza et al. |
| 4,692,760 A | 9/1987 | Unno et al. |
| 4,736,123 A | 4/1988 | Miyazawa et al. |
| 4,797,580 A | 1/1989 | Sunter |
| 4,839,636 A | 6/1989 | Zeiss |
| 4,855,683 A | 8/1989 | Troudet et al. |
| 4,868,525 A | 9/1989 | Dias |
| 4,882,549 A | 11/1989 | Galani et al. |
| 4,947,169 A | 8/1990 | Smith et al. |
| 4,980,653 A | 12/1990 | Shepherd |
| 4,988,983 A | 1/1991 | Wehrer |
| 5,019,729 A | 5/1991 | Kimura et al. |
| 5,036,300 A | 7/1991 | Nicolai |
| 5,043,655 A | 8/1991 | Anholm, Jr. et al. |
| 5,073,757 A | 12/1991 | George |
| 5,095,280 A | 3/1992 | Wunner et al. |
| 5,111,081 A | 5/1992 | Atallah |
| 5,140,197 A | 8/1992 | Grider |
| 5,142,247 A | 8/1992 | Lada, Jr. et al. |
| 5,144,254 A | 9/1992 | Wilke |
| 5,150,079 A | 9/1992 | Williams et al. |
| 5,175,884 A | 12/1992 | Suarez |
| 5,200,751 A | 4/1993 | Smith |
| 5,268,599 A | 12/1993 | Matsui |
| 5,289,138 A | 2/1994 | Wang |
| 5,304,955 A | 4/1994 | Atriss et al. |
| 5,319,370 A | 6/1994 | Signore et al. |
| 5,321,319 A | 6/1994 | Mahmood |
| 5,345,195 A | 9/1994 | Cordoba et al. |
| 5,349,544 A | 9/1994 | Wright et al. |
| 5,355,033 A | 10/1994 | Jang |
| 5,381,116 A | 1/1995 | Nuckolls et al. |
| 5,408,191 A | 4/1995 | Han et al. |
| 5,420,543 A | 5/1995 | Lundberg et al. |
| 5,428,319 A | 6/1995 | Marvin et al. |
| 5,432,665 A | 7/1995 | Hopkins |
| 5,440,305 A | 8/1995 | Signore et al. |
| 5,446,867 A | 8/1995 | Young et al. |
| 5,451,912 A | 9/1995 | Torode |
| 5,473,285 A | 12/1995 | Nuckolls et al. |
| 5,481,179 A | 1/1996 | Keeth |
| 5,495,205 A | 2/1996 | Parker et al. |
| 5,506,875 A | 4/1996 | Nuckolls et al. |
| 5,511,100 A | 4/1996 | Lundberg et al. |
| 5,525,933 A | 6/1996 | Matsuki et al. |
| 5,546,433 A | 8/1996 | Tran et al. |
| 5,552,748 A | 9/1996 | O'Shaughnessy |
| 5,554,942 A | 9/1996 | Herr et al. |
| 5,559,502 A | 9/1996 | Schutte |
| 5,563,553 A | 10/1996 | Jackson |
| 5,565,819 A | 10/1996 | Cooper |
| 5,583,501 A | 12/1996 | Henrion et al. |
| 5,589,783 A | 12/1996 | McClure |
| 5,594,612 A | 1/1997 | Henrion |
| 5,604,466 A | 2/1997 | Dreps et al. |
| 5,608,770 A | 3/1997 | Noguchi et al. |
| 5,610,550 A | 3/1997 | Furutani |
| 5,610,955 A | 3/1997 | Bland |
| 5,614,869 A | 3/1997 | Bland |
| 5,642,027 A | 6/1997 | Windes et al. |
| 5,644,254 A | 7/1997 | Boudry |
| 5,666,118 A | 9/1997 | Gersbach |
| 5,668,506 A | 9/1997 | Watanabe et al. |
| 5,670,915 A | 9/1997 | Cooper et al. |
| 5,673,004 A | 9/1997 | Park |
| 5,675,813 A | 10/1997 | Holmdahl |
| 5,682,049 A | 10/1997 | Nguyen |
| 5,684,434 A | 11/1997 | Mann et al. |
| 5,686,863 A | 11/1997 | Whiteside |
| 5,689,196 A | 11/1997 | Schutte |
| 5,699,024 A | 12/1997 | Manlove et al. |
| 5,703,537 A | 12/1997 | Bland et al. |
| 5,703,540 A | 12/1997 | Gazda et al. |
| 5,726,597 A | 3/1998 | Petty et al. |
| 5,729,165 A | 3/1998 | Lou et al. |
| 5,739,700 A | 4/1998 | Martin |
| 5,796,312 A | 8/1998 | Hull et al. |
| 5,805,909 A | 9/1998 | Diewald |
| 5,818,370 A | 10/1998 | Sooch et al. |
| 5,825,317 A | 10/1998 | Anderson et al. |
| 5,845,151 A | 12/1998 | Story et al. |
| 5,845,181 A | 12/1998 | Bartscher |
| 5,867,015 A | 2/1999 | Corsi et al. |
| 5,870,004 A | 2/1999 | Lu |
| 5,870,345 A | 2/1999 | Stecker |
| 5,872,464 A | 2/1999 | Gradinariu |
| 5,877,656 A | 3/1999 | Mann et al. |
| 5,898,345 A | 4/1999 | Namura et al. |
| 5,949,408 A | 9/1999 | Kang et al. |
| 6,040,707 A | 3/2000 | Young et al. |
| 6,118,439 A | 9/2000 | Ho et al. |
| 6,124,840 A | 9/2000 | Kwon |
| 6,141,007 A | 10/2000 | Lebling et al. |
| 6,157,266 A | 12/2000 | Tsai et al. |
| 6,191,660 B1 | 2/2001 | Mar et al. |
| 6,199,969 B1 | 3/2001 | Haflinger et al. |
| 6,211,739 B1 | 4/2001 | Synder et al. |
| 6,215,835 B1 | 4/2001 | Kyles |
| 6,219,736 B1 | 4/2001 | Klingman |
| 6,225,992 B1 | 5/2001 | Hsu et al. |
| 6,266,715 B1 | 7/2001 | Loyer et al. |
| 6,294,962 B1 | 9/2001 | Mar |
| 6,297,705 B1 | 10/2001 | Williams et al. |
| 6,357,011 B2 | 3/2002 | Gilbert |
| 6,407,641 B1 | 6/2002 | Williams et al. |
| 6,433,645 B1 | 8/2002 | Mann et al. |
| 6,466,036 B1 | 10/2002 | Philipp |
| 6,515,551 B1 | 2/2003 | Mar et al. |
| 6,525,616 B1 | 2/2003 | Williams et al. |
| 6,646,514 B2 | 11/2003 | Sutliff et al. |
| 6,701,508 B1 | 3/2004 | Bartz et al. |
| 6,708,233 B1 | 3/2004 | Fuller et al. |
| 6,708,247 B1 | 3/2004 | Barret et al. |
| 6,710,788 B1 | 3/2004 | Freach et al. |
| 6,742,076 B2 | 5/2004 | Wang et al. |
| 6,753,739 B1 | 6/2004 | Mar et al. |
| 6,807,109 B2 | 10/2004 | Tomishima |
| 6,812,678 B1 | 11/2004 | Brohlin |
| 6,909,414 B2 | 6/2005 | Tsuchi et al. |
| 6,922,063 B2 | 7/2005 | Heger |
| 6,946,920 B1 | 9/2005 | Williams et al. |
| 6,960,953 B2 | 11/2005 | Ichihara |
| 6,961,665 B2 | 11/2005 | Slezak |
| 6,966,039 B1 | 11/2005 | Bartz et al. |
| 6,989,659 B2 | 1/2006 | Menegoli et al. |
| 7,010,773 B1 | 3/2006 | Bartz et al. |
| 7,139,999 B2 | 11/2006 | Bowman-Amuah |
| 7,170,257 B2 | 1/2007 | Oh |
| 7,212,183 B2 | 5/2007 | Tobita |
| 7,276,977 B2 | 10/2007 | Self |
| 7,319,999 B2 | 1/2008 | Evans |
| 7,348,861 B1 | 3/2008 | Wu et al. |
| 7,375,593 B2 | 5/2008 | Self |
| 7,391,204 B2 | 6/2008 | Bicking |
| 7,397,226 B1 | 7/2008 | Mannama et al. |
| 7,439,777 B2 | 10/2008 | Wood |
| 7,446,747 B2 | 11/2008 | Youngblood et al. |
| 7,576,582 B2 * | 8/2009 | Lee et al. .................... 327/202 |
| 7,600,156 B2 | 10/2009 | Thornley et al. |
| 7,612,527 B2 | 11/2009 | Hoffman et al. |
| 7,631,111 B2 | 12/2009 | Monks et al. |
| 7,932,774 B2 * | 4/2011 | Bonaccio et al. ............ 327/553 |
| 8,085,020 B1 | 12/2011 | Bennett |
| 8,164,365 B2 | 4/2012 | Wright et al. |
| 2001/0040569 A1 | 11/2001 | Liang |
| 2002/0033804 A1 | 3/2002 | Liang et al. |
| 2002/0035618 A1 | 3/2002 | Mendez et al. |
| 2003/0112215 A1 | 6/2003 | Hector et al. |
| 2003/0122734 A1 | 7/2003 | Chien et al. |
| 2003/0233631 A1 | 12/2003 | Curry et al. |
| 2004/0046724 A1 | 3/2004 | Woo et al. |
| 2004/0056833 A1 | 3/2004 | Kitagawa et al. |

(56) References Cited

U.S. PATENT DOCUMENTS

| | | |
|---|---|---|
| 2004/0070559 A1 | 4/2004 | Liang |
| 2004/0145551 A1 | 7/2004 | Tobita |
| 2004/0189573 A1 | 9/2004 | Lee et al. |
| 2004/0201627 A1 | 10/2004 | Maddocks et al. |
| 2004/0217799 A1 | 11/2004 | Ichihara |
| 2004/0250231 A1 | 12/2004 | Killian et al. |
| 2005/0057482 A1 | 3/2005 | Youngblood et al. |
| 2005/0140659 A1 | 6/2005 | Hohl et al. |
| 2006/0033474 A1 | 2/2006 | Shum |
| 2006/0244739 A1 | 11/2006 | Tsai |
| 2006/0255860 A1 | 11/2006 | Moussavi |
| 2007/0002007 A1 | 1/2007 | Tam |
| 2007/0024544 A1 | 2/2007 | Chung et al. |
| 2007/0029975 A1 | 2/2007 | Martin et al. |
| 2007/0139338 A1 | 6/2007 | Lin et al. |
| 2007/0170931 A1 | 7/2007 | Snyder |
| 2008/0036473 A1 | 2/2008 | Jansson |
| 2008/0123238 A1 | 5/2008 | Campos et al. |
| 2008/0131145 A1 | 6/2008 | Tao et al. |
| 2008/0203977 A1 | 8/2008 | Raimar et al. |
| 2008/0224667 A1* | 9/2008 | Tanaka et al. ............... 320/139 |
| 2008/0258740 A1 | 10/2008 | Wright et al. |
| 2008/0258797 A1 | 10/2008 | Wright et al. |
| 2008/0259017 A1 | 10/2008 | Wright et al. |
| 2008/0259065 A1 | 10/2008 | Wright et al. |
| 2008/0259070 A1 | 10/2008 | Snyder et al. |
| 2008/0263243 A1 | 10/2008 | Wright et al. |
| 2008/0263260 A1 | 10/2008 | Snyder et al. |
| 2009/0054129 A1 | 2/2009 | Yoshimura et al. |
| 2011/0234264 A1 | 9/2011 | Wright et al. |
| 2011/0248692 A1 | 10/2011 | Shehu et al. |
| 2012/0013322 A1* | 1/2012 | Dearborn .................. 323/283 |

FOREIGN PATENT DOCUMENTS

| | | |
|---|---|---|
| JP | 291161 A1 | 11/1990 |
| JP | 297223 A1 | 12/1991 |
| JP | 5041651 A | 2/1993 |
| WO | WO8906456 A1 | 7/1989 |
| WO | PCTUS9617305 A1 | 6/1996 |
| WO | WO9736230 A1 | 10/1997 |
| WO | PCTUS9834376 A1 | 8/1998 |
| WO | PCTUS9909712 A1 | 2/1999 |

OTHER PUBLICATIONS

Mohammad Al-Shyoukh and Hot Lee_A Compact Fully-Integrated Extremum-Selector-Based Soft-Start Circuit for Voltage Regulators in Bulk CMOS Technologies_Oct. 2010_5 pages.
Search Report for U.S. Appl. No. 13/432,038; Dated Mar. 2012, 12 pages.
L. Richard Carley, "Trimming Analog Circuits Using Floating-Gate Analog MOS Memory," IEEE Journal of Solid-State Circuits, vol. 24, No. 6, Dec. 1989, pp. 1569-1575; 7 pages.
USPTO Notice of Allowance for U.S. Appl. No. 11/983,578 dated Mar. 14, 2013; 10 pages.
"An Analog PLL-Based Clock and Data Recovery Circuit with High Input Jitter Tolerance", by Sam Yinshang Sun, Reprinted from IEEE Journal of Solid-State Circuits, vol. SC-24, pp. 325-330, Apr. 1989, pp. 383-385.
"PSoC Mixed Signal Array," Final Data Sheet, Cypress Semiconductor Corporation, Apr. 24, 2007, Document No. 001-05356; 31 pages.
U.S. Appl. No. 11/843,216 "Non-Resistive Load Driver," David Wright et al., filed Aug. 22, 2007; 18 pages.
U.S. Appl. No. 11/855,281 "Reducing Power Consumption in a Liquid Crystal Display," David Wright et al., filed Sep. 14, 2007; 26 pages.
U.S. Appl. No. 11/965,520 "Active Liquid Crystal Display Drivers and Duty Cycle Operation," Warren Snyder et al., filed Dec. 27, 2007; 28 pages.
U.S. Appl. No. 11/983,578: "Boost Buffer Aid for Reference Buffer" Nandakishore Raimar et al., filed Nov. 09, 2007; 48 pages.
Bakker et al., "Micropower CMOS Temperature Sensor with Digital Output," IEEE Journal of Solid-State Circuits, Jul. 1996; 3 pages.
Cacharelis et al., "A Fully Modular 1 um CMOS Technology Incorporating EEPROM, EPROM and Interpoly Capacitors," 20th European Solid State Device Research Conference, Nottingham, Sep. 1990, pp. 547-550; 4 pages.
Cacharelis et al., "A Modular 1 um CMOS Single Polysilicon EPROM PLD Technology," Aug. 1988 IEEE, pp. 60-IEDM 88 to 63-IEDM 88; 4 pages.
Cuppens et al., "An EEPROM for Microprocessors and Custom Logic," IEEE Journal of Solid-State Circuits, vol. SC-20, No. 2, Apr. 1985, pp. 603-608; 6 pages.
CY7C63722/23 CY7C63742/43 enCoRe USB Combination Low-Speed USB & PS/2 Peripheral Controller, Cypress Semiconductor Corporation, Revised May 2000; 48 pages.
Cypress Semiconductor Marketing Brochure, "Timing Technology Products," Published Nov. 1993, a publication of Cypress Semiconductor in San Jose, CA, pp. 5-7; 5 pages.
Electronic Engineering Times, "TI's Quantum Leap," Issue 517, Dec. 19, 1988, pp. 1 and 86; 2 pages.
Frake et al., "A 9ns, Low Standby Power CMOS PLD with a Single-Poly EPROM Cell," 1989 IEEE International Solid-State Circuits Conference, Feb. 17, 1989, pp. 230-231 and 346; 3 pages.
Hoe et al., "Cell and Circuit Design for Single-Poly EPROM," IEEE Journal of Solid-State Circuits, vol. 24, No. 4, Aug. 1989, pp. 1153-1157; 5 pages.
International Search Report for International Application No. PCT/US08/60699 dated Jun. 18, 2009; 6 pages.
Jan Axelson, "USB Complete: Everything You Need to Develop USB Peripherals," 3rd Edition, Copyright 1999-2005, ISBN 978-1-931448-03-1, pp. 51-59, 85-91, 225; 20 pages.
Kazerounian et al., "A Single Poly EPROM for Custom CMOS Logic Applications," IEEE 1986 Custom Integrated Circuits Conference, 1986, pp. 59-62; 4 pages.
Kim et al- "A 30-MHz Hybrid Analog/Digital Clock Recovery Circuit in 2-um CMOS," IEEE Journal of Solid-State Circuits, vol. 25, No. 6, Dec. 1990, pp. 1385-1394; 10 pages.
Kim et al., "Low-Power High-Slew-Rate CMOS Buffer Amplifier for Flat Panel Display Drivers," Electronic Letters, Feb. 16, 2006, vol. 42, No. 4, <http://circuit.kaist.ac.kr/upload_files.pdf>; 2 pages.
Miyamoto et al., "An Experimental 5-V-Only 256-kbit CMOS EEPROM with a High-Performance Single-Polysilicon Cell," IEEE Journal of Solid State Circuits, vol. SC-21, No. 5, Oct. 1986, pp. 852-860; 9 pages.
Ohsaki et al., "A Planar Type EEPROM Cell Structure by Standard CMOS Process and Applications," VLSI Technology, Digest of Technical Papers, May 1993, pp. 55-66; 2 pages.
Ohsaki et al., "A Planar Type EEPROM Cell Structure by Standard CMOS Process for Integration with GATE Array, Standard Cell, Microprocessor and for Neural Chips," IEEE 1993 Custom Integrated Circuits Conference, 1993, pp. 23.6.1-23.6.4; 4 pages.
Ohsaki et al., "A Single Poly EEPROM Cell Structure for Use in Standard CMOS Processes," IEEE Journal of Solid-State Circuits, vol. 29, No. 3, Mar. 1994, pp. 311-316; 6 pages.
Ohsaki et al., "SIPPOS (Single Poly Pure CMOS) EEPROM Embedded FPGA by News Ring Interconnection and Highway Path," IEEE 1994 Custom Integrated Circuits Conference, 1994, pp. 189-192; 4 pages.
Robert A. Blauschild, "WP 3.5: An Integrated Time Reference," ISSCC94/Session 3, Analog Techniques/Paper WP 3.5, Feb. 1994, pp. 56-58; 4 pages.
Robert Jania, "Cypress' CapSense Successive Approximation Algorithm," Whiat Paper CSA RJO.doc, Jan. 17, 2007; 6 pages.
S.M. Sze, "Physics of Semiconductor Devices," 2nd Edition, John Wiley & Sons, New York, 1981, pp. 496-506; 13 pages.
Sugino et al., "Analysis of Writing and Erasing Procedure of Flotox EEPROM Using the New Charge Balance Condition (CBC) Model," NUPAD IV, May and Jun. 1992, pp. 65-69; 5 pages.
T.J. Giles, "A University Frequency Synthesizer IC," Aug. 1979, Philips Telecommunication Review, vol. 37, No. 3, pp. 177-181; 6 pages.

(56) References Cited

OTHER PUBLICATIONS

Takebuchi et al., "A Novel Integration Technology of EEPROM Embedded CMOS LOGIC VLSI Suitable for ASIC Applications," IEEE 1992 Custom Integrated Circuits Conference, 1992, pp. 9.6.1-9.6.4; 4 pages.
Universal Serial Bus Specification, Chapter 7—Electrical, Version 1.0; Jan. 15, 1996, pp. 111-143; 34 pages.
USPTO Advisory Action for U.S. Appl. No. 11/855,281 dated Mar. 3, 2011; 4 pages.
USPTO Advisory Action for U.S. Appl. No. 11/965,485 dated Nov. 21, 2012; 3 pages.
USPTO Advisory Action for U.S. Appl. No. 11/965,520 dated Aug. 23, 2011; 3 pages.
USPTO Advisory Action for U.S. Appl. No. 11/965,520 dated Oct. 17, 2012; 2 pages.
USPTO Advisory Action for U.S. Appl. No. 13/100,876 dated Oct. 4, 2012; 3 pages.
USPTO Final Rejection for U.S. Appl. No. 11/855,281 dated Dec. 16, 2010; 13 pages.
USPTO Final Rejection for U.S. Appl. No. 11/965,520 dated Jun. 8, 2011; 14 pages.
USPTO Final Rejection for U.S. Appl. No. 11/965,520 dated Aug. 6, 2012; 13 pages.
USPTO Final Rejection for U.S. Appl. No. 11/983,578 dated May 8, 2012; 11 pages.
USPTO Final Rejection for U.S. Appl. No. 13/100,876 dated Jul. 19, 2012; 6 pages.
USPTO Non-Final Rejection for U.S. Appl. No. 11/843,216 dated Oct. 6, 2009; 7 pages.
USPTO Non-Final Rejection for U.S. Appl. No. 11/855,281 dated Jan. 22, 2013; 8 pages.
USPTO Non-Final Rejection for U.S. Appl. No. 11/855,281 dated Jul. 1, 2010; 10 pages.
USPTO Non-Final Rejection for U.S. Appl. No. 11/965,520 dated Sep. 29, 2010; 11 pages.
USPTO Non-Final Rejection for U.S. Appl. No. 11/965,520 dated Dec. 18, 2012; 13 pages.
USPTO Advisory Action for U.S. Appl. No. 11/965,520 dated Sep. 11, 2013; 3 pages.
USPTO Final Rejection for U.S. Appl. No. 11/855,281 dated Mar. 26, 2014; 13 pages.
USPTO Final Rejection for U.S. Appl. No. 11/855,281 dated Jul. 5, 2013; 9 pages.
USPTO Final Rejection for U.S. Appl. No. 11/965,520 dated Jul. 8, 2013; 10 pages.
USPTO Non-Final Rejection for U.S. Appl. No. 11/965,520 dated Dec. 7, 2011; 11pages.
USPTO Non-Final Rejection for U.S. Appl. No. 11/983,578 dated Oct. 7, 2011; 7 pages.
USPTO Non-Final Rejection for U.S. Appl. No. 13/100,876 dated Dec. 7, 2011; 6 pages.
USPTO Notice of Allowance for U.S. Appl. No. 11/843,216 dated Feb. 22, 2010; 6 pages.
USPTO Notice of Allowance for U.S. Appl. No. 11/983,578 dated Jul. 25, 2012; 10 pages.
USPTO Notice of Allowance for U.S. Appl. No. 13/100,876 dated May 17, 2013; 8 pages.
Written Opinion of the International Searching Authority for International Application No. PCT/US2008/60699 dated Jun. 18, 2009; 4 pages.
Yoshikawa et al., "An EPROM Cell Structure for EPLD's Compatible with Single Poly-Si Gate Processes," IEEE Transactions on Electron Devices, vol. 37, No. 3, Mar. 1990, pp. 675-679; 5 pages.
USPTO Non-Final Rejection for U.S. Appl. No. 11/855,281 dated Nov. 25, 2013; 13 pages.
USPTO Notice of Allowance for U.S. Appl. No. 11/965,520 dated Nov. 18, 2013; 7 pages.
USPTO Final Rejection for U.S. Appl. No. 14/066,263 dated Oct. 22, 2014; 15 pages.
USPTO Non-Final Rejection for U.S. Appl. No. 11/855,281 dated Nov. 5, 2014; 14 pages.
USPTO Non-Final Rejection for U.S. Appl. No. 14/066,263 dated Sep. 25, 2014; 13 pages.
USPTO Advisory Action for U.S. Appl. No. 11/855,281 dated Apr. 17, 2015; 3 pages.
USPTO Notice of Allowance for U.S. Appl. No. 14/066,263dated Mar. 6, 2015; 9 pages.
USPTO Notice of Allowance for U.S. Appl. No. 14/066,263 dated Apr. 14, 2015; 8 pages.
SIPO Office Action for Chinese Application No. 201210321742.5 dated May 25, 2015; 3 pages.
SIPO Office Action for Chinese Application No. 201210321742.5 dated Jan. 28, 2016; 3 pages.
USPTO Final Rejection for U.S. Appl. No. 11/855,281 dated Mar. 12, 2015; 16 pages.
USPTO Notice of Allowance for U.S. Appl. No. 11/855,281 dated Mar. 30, 2016; 13 pages.

\* cited by examiner

SYSTEMS AND METHODS FOR STARTING UP ANALOG CIRCUITS

RELATED APPLICATIONS

This application claims the benefit of and priority to the U.S. Provisional Application No. 61/566,233 filed Dec. 2, 2011.

BACKGROUND

Field

Various embodiments relate to electronic circuits and, particularly, to circuits, systems, and methods for starting up analog circuits.

Description of the Related Art

Contemporary startup circuits utilize operational amplifiers with very large, high current devices that generate a large tail current to source or sink a maximum amount of current for driving the load and generating the desired analog voltage on the output in the specified time. One disadvantage of these startup circuits is that the operational amplifiers are part of a closed loop system and therefore, even high speed operational amplifiers can only respond as fast as the feedback loop will allow. Therefore, contemporary startup circuit require large operational amplifiers that source large amounts of current, which results in relatively slow startup during standby to active conditions.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE DRAWINGS

Figure 1:
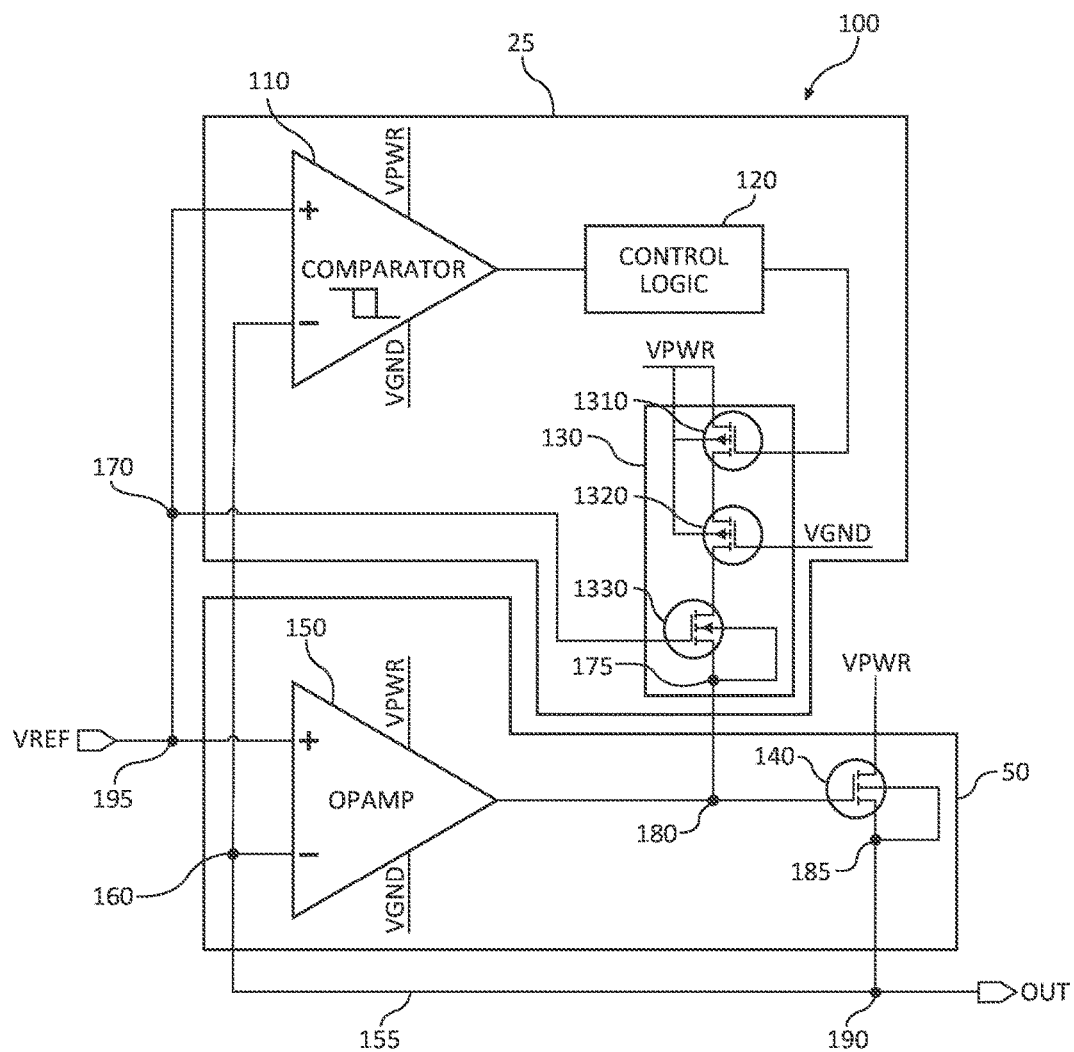
FIG. 1 is a schematic diagram of one embodiment of a startup circuit for analog circuits.

Reference in the description to "one embodiment" or "an embodiment" means that a particular feature, structure, or characteristic described in connection with the embodiment is included in at least one embodiment of the invention. The phrase "in one embodiment" located in various places in this description does not necessarily refer to the same embodiment.

In the following detailed description, for purposes of explanation, numerous specific details are set forth in order to provide a thorough understanding of the subject matter of the present application. It will be evident, however, to one skilled in the art that the disclosed embodiments, the claimed subject matter, and their equivalents may be practiced without these specific details.

The detailed description includes references to the accompanying drawings, which form a part of the detailed description. The drawings show illustrations in accordance with example embodiments. These embodiments, which may also be referred to herein as "examples," are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the subject matter but rather to enable one skilled in the art to practice, make, and/or use the subject matter.

Various embodiments provide startup circuits. One startup circuit comprises an output node including an output voltage (VOUT), a comparator comprising a first input configured to be coupled to a reference voltage (VREF), a second input, and an output. The startup circuit further comprises a feedback loop coupling the output node to the second input and a turbo circuit coupled between the output and the output node and configured to be coupled to a supply voltage (VPWR). The turbo circuit is configured to increase VOUT, the comparator is configured to compare VOUT and VREF, and the turbo circuit is enabled and disabled based on the comparison of VOUT and VREF.

Other embodiments provide electronics systems. One electronic system comprises VREF, an analog device, and a startup circuit coupled to the analog device and to VREF. The startup circuit comprises VOUT, a startup portion, and a driver portion. The startup circuit is configured to enable the startup portion to start up the driver portion when VOUT is less than a predetermined voltage of VREF, disable the startup portion when VOUT is within the predetermined voltage of VOUT, and enable the driver portion to drive the analog device subsequent to disabling the startup portion.

Methods for starting an analog device via a startup circuit including a startup portion and a driver portion are further provided. One method comprises enabling the startup portion to start up the driver portion when VOUT of the startup circuit is outside a predetermined voltage of VREF, disabling the startup portion when VOUT is within the predetermined voltage of VREF, and enabling the driver portion to drive the analog device subsequent to disabling the startup portion.

Turning now to the figures, FIG. 1 is a block diagram of one embodiment of a startup circuit 100 for analog devices. At least in the illustrated embodiment, circuit 100 comprises a comparator 110, control logic 120, a turbo circuit 130, an n-channel metal oxide semiconductor field-effect transistor (nMOSFET) 140 that forms an n-follower device, an operational amplifier (op amp) 150, and a feedback loop 155. In one embodiment, comparator 110, control logic 120, turbo circuit 130, and feedback loop 155 comprise a startup portion 25 of circuit 100 and nMOSFET 140, op amp 150, and feedback loop 155 comprise a driver portion 50 of circuit 100.

Comparator 110 may be a comparator, comparing device, and/or comparing system known in the art or developed in the future. In various embodiments, comparator 110 is disabled by a signal from control logic 120 to eliminate and/or reduce any unnecessary power consumption.

Comparator 110 is configured with minimal hysteresis (e.g., +/−5 mV) so that comparator 110 disables turbo circuit 130 within a desired analog output voltage (VOUT). That is, comparator 110 is configured to "trip" at a voltage within a predetermined voltage of VREF. In one embodiment, VREF may be any voltage in the range of about 0.6 volts to about 1.2 volts. For example, comparator 110 may be configured to trip at a voltage (e.g., hysteresis) in the range of about 5 mV to about 50 mV of VREF, although other ranges of hysteresis may be utilized depending on the application of circuit 100. In one embodiment, comparator 110 is configured to trip at a voltage of about 5 mV of VREF.

As illustrated in FIG. 1, the positive input of comparator 110 is coupled to a reference voltage (VREF) and the negative input of comparator 110 is coupled to a node 160. The output of comparator 110 is coupled to an input of control logic 120.

Control logic 120 may be any control logic, circuit, and/or system capable of providing a control signal (e.g., a logic high signal or logic low signal) in response to receiving an input from comparator 110. In one embodiment, control logic 120 is configured to output the logic low signal (e.g., a logic 0 signal or 0 volt signal) in response to receiving a signal from comparator 110 indicating that VREF is the larger voltage and output the logic high signal (e.g., a logic 1 signal or a 1.2 volt signal) in response to receiving a signal from comparator 110 indicating that VOUT is the larger voltage. Control logic 120 is coupled to turbo circuit 130 and is configured to output the control signal to turbo circuit 130.

Turbo circuit 130, in one embodiment, comprises a p-channel metal oxide semiconductor field-effect transistor (pMOSFET) 1310, a pMOSFET 1320, and an nMOSFET 1330. The gate of pMOSFET 1310 is coupled to the output of control logic 120 and is configured to receive the control signal generated by control logic 120. The source and bulk of pMOSFET 1310 are coupled to a supply voltage (VPWR) and the drain of pMOSFET 1310 is coupled to the source of pMOSFET 1320.

The bulk of pMOSFET 1320 is coupled to VPWR and the gate of pMOSFET 1320 is coupled to ground (VGND). The drain of pMOSFET 1320 is coupled to the source of nMOSFET 1330.

The gate of nMOSFET 1330 is coupled to a node 170 that is coupled to the positive input of comparator 110. The bulk and drain of nMOSFET 1330 are coupled to a node 175 that is coupled to a node 180.

Node 180 is coupled to the gate of nMOSFET 140 (i.e., the n-follower device) and the drain of nMOSFET 140 is coupled to VPWR. The bulk and source of nMOSFET 140 are coupled to a node 185.

Node 185 is coupled to a node 190 that is coupled to the output (OUT) of circuit 100 and to node 160, which is coupled to the negative terminal of op amp 150. Op amp 150 may be any operational amplifier known in the art or developed in the future. In various embodiments, op amp 150 is a high gain amplifier rated at less than 10 µA. In one embodiment, op amp 150 is a 5 µA high gain operational amplifier. The output of op amp 150 is coupled to node 180 and the positive input of op amp 150 is coupled to a node 195 that is coupled to VREF and to node 170.

VOUT being coupled to the negative terminal of comparator 110 and the negative terminal of op amp 150 forms a feedback loop 197. That is, VOUT is provided to both comparator 110 and op amp 150 so that VOUT can be compared to VREF by comparator 110 and used as for a unity gain amplifier by op amp 150.

Various embodiments of circuit 100 utilize smaller electronic devices than previous startup circuits. Specifically, turbo circuit 130 enables circuit to use a smaller operational amplifier (i.e., op amp 150) and smaller amounts of current than previous startup circuits.

Below is a description of the operation of one embodiment of circuit 100. However, the various embodiments of circuit 100 are not limited to the following operational description of circuit 100.

When circuit 100 is enabled (e.g., when the voltage at the positive terminals of comparator 110 and op amp 150 are at VREF and the gate of nMOSFET 140 and OUT is at VGND), comparator 110 turns ON, which results in control logic 120 providing a logic low signal to turbo circuit 130. Specifically, the logic low signal from control logic 120 causes pMOSFET 1310 to turn ON. pMOSFET being ON causes pMOSFET 1320 to turn ON.

pMOSFET 1320 being ON results in the source of nMOSFET 1330 being at VPWR, the gate of nMOSFET 1330 being a VREF, and the drain of nMOSFET 1330 goes to VREF since this nMOSFET 1330 is a native or zero threshold device. In this situation, the output of op amp 150 goes to approximately VREF via the negative feedback 155, which supplies the gate to nMOSFET 140. Here, pMOSFET 1310 and pMOSFET 1320 operate in the linear region emulating a resistor, in series with a zero threshold voltage (depletion) n-follower device (i.e., nMOSFET 1330). Since the gate of nMOSFET 140 is coupled to VREF, when enabled, turbo circuit 130 quickly forces the source of nMOSFET 140 to VREF.

When the source of nMOSFET 140 goes to VREF, the output (OUT) rises until the voltage equals VREF. When VOUT is within a predetermined voltage of VREF (e.g., within about 20 mV of VREF), comparator 110 trips.

Comparator 110 tripping results in control logic 120 providing a logic high signal to turbo circuit 130. Specifically, the logic high signal causes pMOSFET 1310 to turn OFF, which causes each of pMOSFET 1320 and nMOSFET 1330 to also turn OFF. With turbo circuit 130 OFF, the output of op amp 150 takes over operation of the feedback loop system maintaining the gate of nMOSFET 140 at a stable voltage to provide output (OUT) with a buffered voltage equal to VREF. Consequently, op amp 150 is able to drive current loads coupled to the output of circuit 100.

Figure 2:
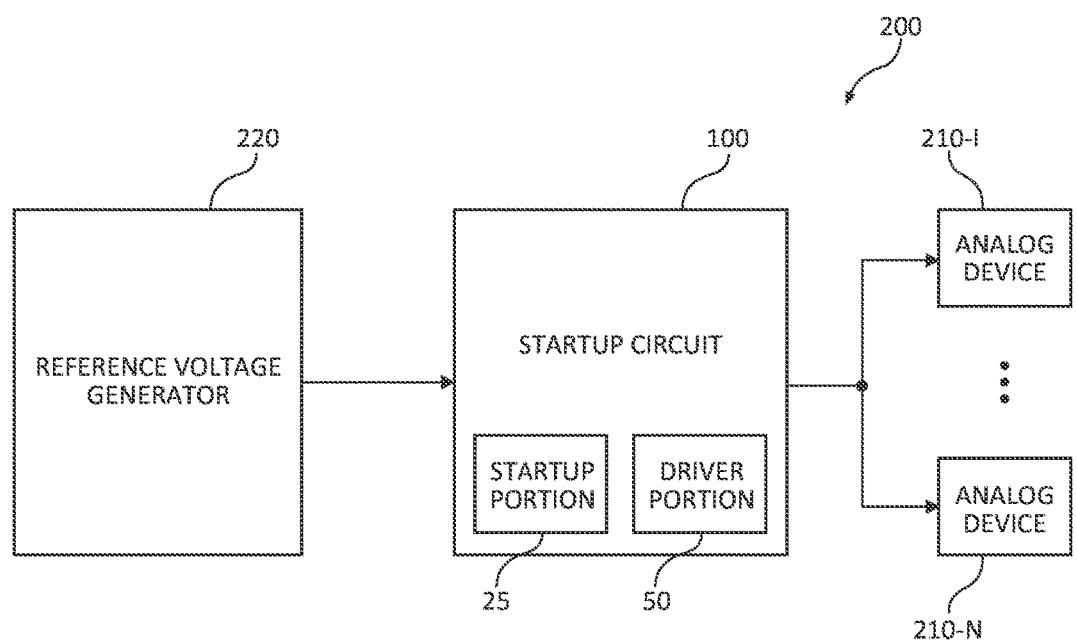
FIG. 2 is a block diagram of one embodiment of a system comprising an analog device and the startup circuit in FIG. 1.

FIG. 2 is block diagram of one embodiment of a system 100 comprising one or more analog devices 210 (e.g., analog device 210-1 through analog device 210-N) and a reference voltage generator 220 coupled to startup circuit 100. Analog device(s) 210 may be any analog device known in the art or developed in the future including a current load that should be driven. Examples of analog device(s) 210 include, but are not limited to an on chip analog power supply domain, a Silicon-Oxide-Nitride-Oxide-Silicon (SONOS) array device for measuring device threshold voltages, a sense amplifier utilized in a memory device, and a reference voltage analog circuit.

In one embodiment, analog devices 210 are each the same type of analog device. In another embodiment, at least two of analog devices 210 are different types of analog devices. In yet another embodiment, analog devices 210 are each different types of analog devices.

Reference voltage generator 220 may be any type of device and/or system capable of generating a stable reference voltage over process voltage and temperature. In one embodiment, reference voltage generator is configured to generate a band gap reference voltage. In other embodiments, reference voltage generator is configured to generate a reference voltage in the range of about 0.6 volts to about 1.2 volts. Reference voltage generator 220 is configured to provide the generated voltage as an input to startup circuit 100.

As discussed above, startup circuit 100 is configured to enable startup portion 25 to start up driver portion 50 when VOUT is less than the predetermined voltage of VREF and disable startup portion 25 when VOUT is within the predetermined voltage of VREF. Furthermore, startup circuit 100 is configured to enable driver portion 50 to drive analog device 210 subsequent to disabling startup portion 25.

Startup portion 25 is enabled when VOUT is outside the range of about 5 mV to about 50 mV of VREF. In one embodiment, startup portion 25 is enabled when VOUT is outside of about 5 mV of VREF.

Startup portion 25 is disabled when VOUT is within the range of about 5 mV to about 50 mV of VREF. In one embodiment, startup portion 25 is disabled when VOUT is within about 5 mV of VREF.

Startup circuit 100 is configured to generate a buffered voltage (e.g., a voltage in the range of about 0.6 volts to about 1.2 volts) that is equal to the reference voltage received as an input from reference voltage generator 220. The buffered voltage is then utilized as an input to analog device(s) 210 to drive analog device(s) 210.

Figure 3:
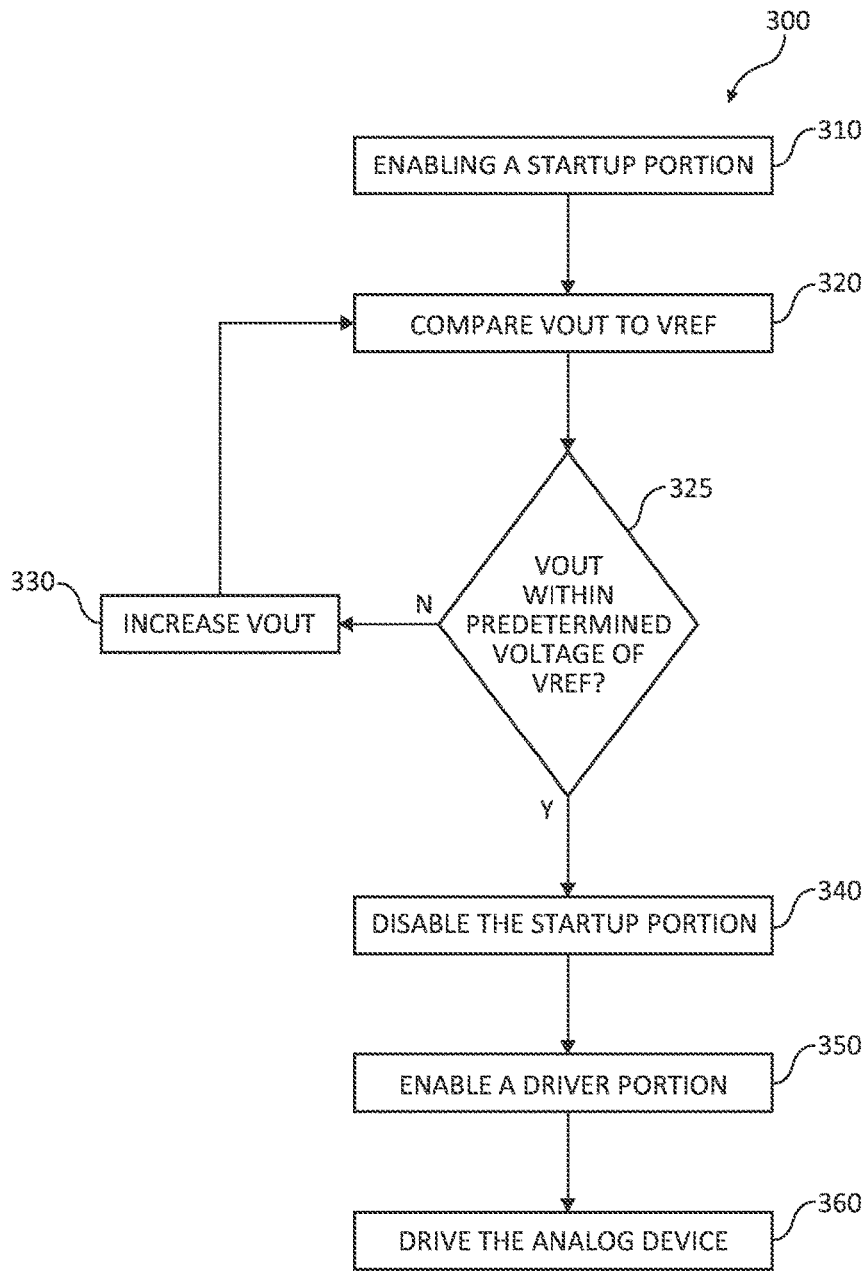
FIG. 3 is a flow diagram of one embodiment of a method for starting an analog device.

FIG. 3 is a flow diagram of one embodiment of a method 300 for starting an analog device (e.g., analog device 210) utilizing a startup circuit (e.g., startup circuit 100). At least in the illustrated embodiment, method 300 starts by enabling a startup portion (e.g., startup portion 25) of the startup circuit (block 310), the various circuit elements in the startup circuit being at ground (VGND). In one embodiment, the startup circuit is enabled when the voltage at an input of the startup circuit is at a reference voltage (VREF), which is larger than VGND.

Method 300 includes comparing the voltage (VOUT) in a feedback loop (e.g., feedback loop 197) to VREF (block 320) to determine if VOUT is less than a predetermined voltage (e.g., 5 mV) of VREF (block 325). If VOUT is less than a predetermined voltage (e.g., 5 mV) of VREF, method 300 comprises increasing VOUT via a turbo circuit (e.g., turbo circuit 130) (block 330) and again comparing VOUT and VREF (block 320). If VOUT is within the predetermined voltage of VREF, method 300 comprises disabling the startup portion (e.g., the turbo circuit) (block 340).

After the turbo circuit is disabled, enabling a driver portion (e.g., driver portion 50) of the startup circuit (block 350). Method 300 further comprises utilizing the gain from the driver portion (op amp 50) to drive the analog device (block 360).

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

As will be appreciated by one of ordinary skill in the art, aspects of the present invention may be embodied as an apparatus, system, or method. Accordingly, aspects of the present invention may take the form of an entirely hardware embodiment or an embodiment combining hardware and software aspects that may all generally be referred to herein as a "circuit," "module," or "system."

Aspects of the present invention are described above with reference to flowchart illustrations and/or block diagrams of methods, apparatus, and systems according to various embodiments. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer, other programmable data processing apparatus, or other devices to function in a particular manner, such that the instructions stored in the computer-readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the above figures illustrate the architecture, functionality, and operation of possible implementations of apparatus, systems, and methods according to various embodiments. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While one or more embodiments have been illustrated in detail, one of ordinary skill in the art will appreciate that modifications and adaptations to those embodiments may be made without departing from the scope of the various embodiments as set forth in the following claims.

What is claimed is:

1. A startup circuit, comprising:
   an output node at an output voltage (VOUT);
   an operational amplifier coupled to the output node;
   a comparator comprising a first input configured to be coupled to a reference voltage (VREF), a second input, and an output;
   a feedback loop coupling the output node to the second input; and a turbo circuit coupled between the output and the output node and configured to be coupled to a supply voltage (VPWR), the turbo circuit is configured to increase VOUT, wherein:
the comparator is configured to compare VOUT and VREF, the turbo circuit is disabled when the VOUT at the output node is within a predetermined voltage of the VREF, the operational amplifier starts up when the VOUT at the output node is outside the predetermined voltage of the VREF, and the operational amplifier drives a load that is coupled to the output node.

2. The startup circuit of claim 1, wherein the turbo circuit comprises:
a first p-channel metal oxide semiconductor field-effect transistor (pMOSFET);
a second pMOSFET coupled to the first pMOSFET; and
a first n-channel metal oxide semiconductor field-effect transistor (nMOSFET).

3. The startup circuit of claim 2, further comprising control logic coupled between the comparator and the turbo circuit, the control logic configured to enable and disable the turbo circuit based on a signal received from the comparator.

4. The startup circuit of claim 3, wherein the comparator is configured to trip when VOUT is within the predetermined voltage of VREF, the signal indicative of whether VOUT is within the predetermined voltage of VREF.

5. The startup circuit of claim 4, wherein the predetermined voltage is a hysteresis in the range of about 5 mV to about 50 mV of VREF.

6. The startup circuit of claim 4, wherein the predetermined voltage is within 5 mV of VREF.

7. The startup circuit of claim 3, wherein:
the first pMOSFET comprises a first gate, a first source, and a first drain;
the second pMOSFET comprises a second gate, a second source, and a second drain;
the first nMOSFET comprises a third gate, a third source, and a third drain;
the first gate is coupled to the control logic, the first source is coupled to VPWR, and the first drain is coupled to the second source;
the second gate is coupled to VGND and the second drain is coupled to the third drain;
and the third gate is coupled to VREF and the third source is coupled to VOUT.

8. The startup circuit of claim 1, wherein the operational amplifier comprises a third input coupled to VREF, a fourth input coupled to the feedback loop, and a second output coupled to a third output of the turbo circuit.

9. The startup circuit of claim 8, further comprising an n-follower device coupled between the output node and a node coupled to the second output and the third output.

10. The startup circuit of claim 9, wherein the n-follower device comprises an n-channel metal oxide semiconductor field-effect transistor (nMOSFET), the nMOSFET comprising:
a gate coupled to the node;
a drain coupled to VPWR;
a source coupled to the output node; and
a bulk coupled to the output node.

11. The startup circuit of claim 1, wherein the startup circuit is coupled between a reference voltage generator and one or more analog devices.

12. A method of operating a startup circuit that includes a comparator and a turbo circuit, the method comprising:
enabling the comparator by applying a reference voltage (VREF) to a first input of the comparator, wherein the comparator comprises an output, the first input, and a second input, wherein the second input is coupled via a feedback loop to an output node at an output voltage (VOUT);
applying a supply voltage (VPWR) to the turbo circuit, wherein the turbo circuit is coupled between the output of the comparator and the output node;
the turbo circuit increasing the VOUT based on a signal from the output of the comparator;
starting up an operational amplifier when the VOUT at the output node is outside a predetermined voltage of the VREF;
the comparator comparing the VOUT to the VREF; and
disabling the turbo circuit when the VOUT is within the predetermined voltage of the VREF;
wherein the operational amplifier is enabled to drive a load coupled to the output node.

13. The method of claim 12, wherein the startup circuit further comprises control logic coupled between the comparator and the turbo circuit, and wherein the method further comprises:
the control logic enabling and disabling the turbo circuit in response to receiving the signal from the output of the comparator.

14. The method of claim 12, wherein the comparator comparing the VOUT to the VREF comprises the comparator tripping when the VOUT is within a predetermined voltage of the VREF, and wherein the signal from the output of the comparator is indicative of whether the VOUT is within the predetermined voltage of the VREF.

15. The method of claim 14, wherein the predetermined voltage is a hysteresis in the range of about 5 mV to about 50 mV of the VREF.

16. The method of claim 14, wherein the predetermined voltage is within 5 mV of the VREF.

17. The method of claim 12, wherein the method further comprises:
enabling the turbo circuit when the VOUT is outside of about 5 mV of the VREF; and
disabling the turbo circuit when the VOUT is within about 5 mV of the VREF.

18. The method of claim 12, further comprising:
enabling the operational amplifier to drive the load subsequent to disabling the turbo circuit.

19. The method of claim 18, wherein the operational amplifier comprises a third input coupled to the VREF, a fourth input coupled to the feedback loop, and a second output coupled to a third output of the turbo circuit.

* * * * *